US012771098B2

(12) United States Patent
Mizuno

(10) Patent No.: US 12,771,098 B2
(45) Date of Patent: Oct. 20, 2026

(54) LASER LIGHT EMITTING DEVICE

(71) Applicant: DENSO CORPORATION, Kariya-city (JP)

(72) Inventor: Fumiaki Mizuno, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 1030 days.

(21) Appl. No.: 17/820,508

(22) Filed: Aug. 17, 2022

(65) Prior Publication Data

US 2022/0393439 A1 Dec. 8, 2022

Related U.S. Application Data

(63) Continuation of application No. PCT/JP2021/005190, filed on Feb. 12, 2021.

(30) Foreign Application Priority Data

Feb. 20, 2020 (JP) ................................ 2020-026829
Dec. 22, 2020 (JP) ................................ 2020-212052

(51) Int. Cl.
*H01S 5/068* (2006.01)
*H01S 5/042* (2006.01)
*H01S 5/0683* (2006.01)
*H01S 5/40* (2006.01)

(52) U.S. Cl.
CPC ............ *H01S 5/4025* (2013.01); *H01S 5/042* (2013.01); *H01S 5/06808* (2013.01); *H01S 5/0683* (2013.01); *H01S 5/0428* (2013.01)

(58) Field of Classification Search
None
See application file for complete search history.

(56) References Cited

U.S. PATENT DOCUMENTS

| | | | | |
|---|---|---|---|---|
| 9,537,956 | B1 | 1/2017 | Sibenac et al. | |
| 9,784,835 | B1 * | 10/2017 | Droz | G01S 17/08 |
| 10,007,000 | B1 * | 6/2018 | Droz | G01S 17/08 |
| 12,218,482 | B2 * | 2/2025 | Saito | H01S 5/0427 |
| 2019/0356109 | A1 * | 11/2019 | Tsuda | B23K 26/0626 |
| 2021/0313763 | A1 * | 10/2021 | Fujiwara | H01S 5/0428 |
| 2022/0200236 | A1 * | 6/2022 | Saito | H01S 5/0427 |
| 2022/0393439 | A1 * | 12/2022 | Mizuno | H01S 5/02345 |

FOREIGN PATENT DOCUMENTS

| | | | |
|---|---|---|---|
| JP | H05-11468 | U | 2/1993 |
| JP | H10-10431 | A | 1/1998 |
| JP | 2009-94280 | A | 4/2009 |
| JP | 2013-70514 | A | 4/2013 |

* cited by examiner

*Primary Examiner* — Tod T Van Roy
(74) *Attorney, Agent, or Firm* — Precision Patents, P.C.

(57) ABSTRACT

In a laser light emitting device including a plurality of laser light emitter each including a laser diode, a drive circuit configured to drive the laser diode by controlling the supply of a drive current to the laser diode, and a drive line through which the drive current flows from the drive circuit to the laser diode, a light emission detector includes a detection pattern placed so as to cause an electromagnetically induced current to flow in response to a drive current flowing through each drive line when the corresponding laser light emitter emits light. The light emission detector detects light emission from a driven laser diode by detecting the current flowing in the detection pattern.

3 Claims, 4 Drawing Sheets

| DRIVE TARGET | FLUX LINKAGE Φ | | DETECTION CURRENT Idt | | DETECTION VOLTAGE Vdt | |
|---|---|---|---|---|---|---|
| | DIRECTION | MAGNITUDE | DIRECTION | MAGNITUDE | DIRECTION | MAGNITUDE |
| 1 | −Z | SMALL | NEGATIVE | SMALL | NEGATIVE | SMALL |
| 2 | −Z | LARGE | NEGATIVE | LARGE | NEGATIVE | LARGE |
| 3 | +Z | LARGE | POSITIVE | LARGE | POSITIVE | LARGE |
| 4 | +Z | SMALL | POSITIVE | SMALL | POSITIVE | SMALL |

LASER LIGHT EMITTING DEVICE

CROSS-REFERENCE TO RELATED APPLICATION

This application is a continuation application of International Application No. PCT/JP2021/005190 filed Feb. 12, 2021 which designated the U.S. and claims priority to Japanese Patent Application No. 2020-026829 filed with the Japan Patent Office on Feb. 20, 2020, and Japanese Patent Application No. 2020-212052 filed with the Japan Patent Office on Dec. 22, 2020, the entire contents of each of which are incorporated herein by reference.

BACKGROUND

Technical Field

The present disclosure relates to a laser light emitting device.

Related Art

A laser radar includes a laser light emitting device for emitting laser light.

DESCRIPTION OF SPECIFIC EMBODIMENTS

The laser light emitting device, as disclosed in JP H10-104341 A, may detect the emission of laser light to control laser light emission timing or detect a light emission failure. The emission of laser light is detected typically by (a) a method of using a fast-response photodiode to detect the actual emitted light or (b) a method of adding a current mirror circuit to a drive circuit and detecting a current flowing in the current mirror circuit as a current corresponding to the drive current flowing in a laser diode. Another drive current detection method may be (c) a method of detecting a current flowing in a detection coil placed for a line through which a drive current flows (see JP UM H05-11468 A).

In laser light emitting devices including a plurality of laser diodes, a circuit for performing any one of the methods (a), (b), and (c) is to be installed for each laser diode. Accordingly, a laser light emitting device including a number of laser diodes needs the same number of components for detecting light emission from the laser diodes, resulting in increased device size and cost.

In view of the foregoing, it is desired to have a laser light emitting device including a plurality of laser diodes have a simple and inexpensive configuration that enables the detection of light emission from each laser diode.

An aspect of the present disclosure provides a laser light emitting device. The laser light emitting device includes: a plurality of laser light emitters each including a laser diode, a drive circuit configured to drive the laser diode by controlling the supply of a drive current to the laser diode, and a drive line through which the drive current flows from the drive circuit to the laser diode; and a light emission detector including a detection pattern placed so as to cause an electromagnetically induced current to flow in response to a drive current flowing through each drive line when the corresponding laser light emitter emits light. The light emission detector detects light emission from a driven laser diode by detecting the current flowing in the detection pattern.

The laser light emitting device can detect light emission from a driven laser diode by using the detector including the single detection pattern, thus enabling the detection of light emission from a driven laser diode with a configuration simpler and more inexpensive than the configuration described in the Background Art section.

A. Embodiments

Figures 1, 2:
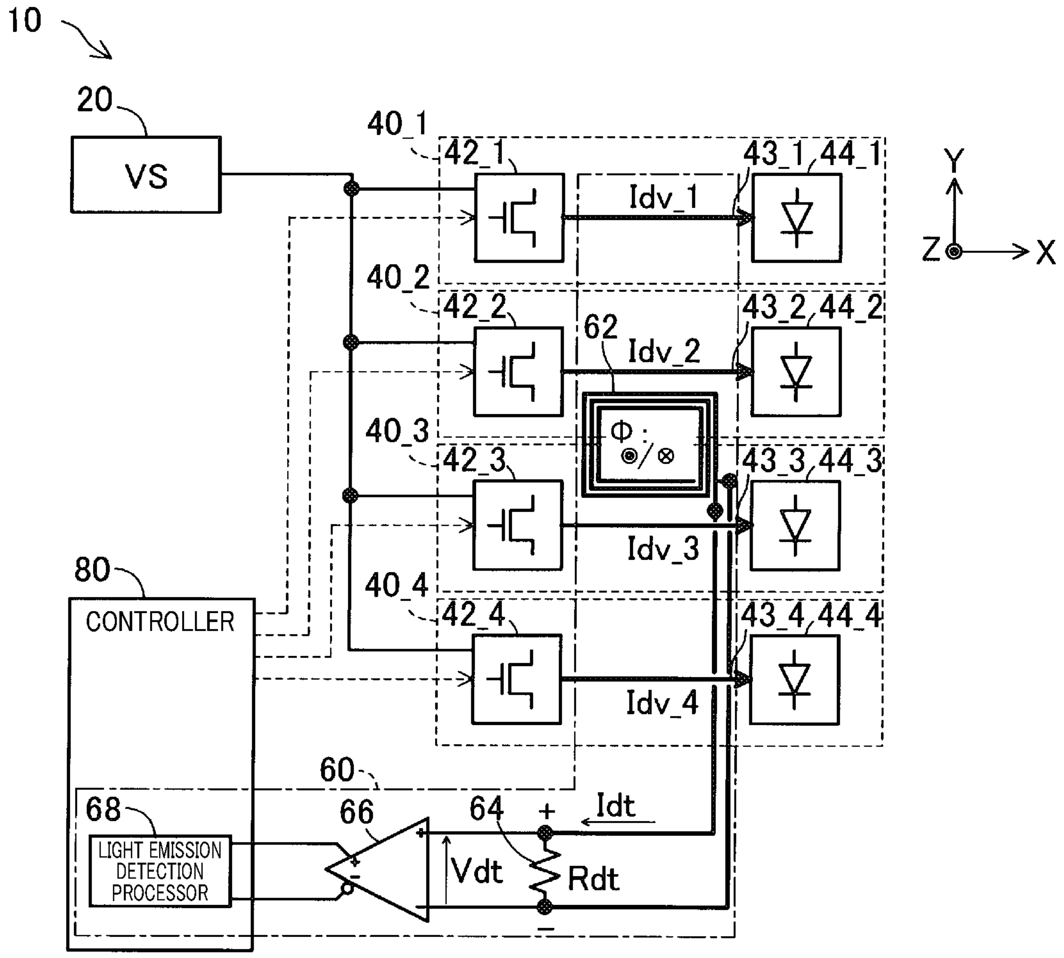
FIG. 1 is a schematic configuration diagram of a laser light emitting device.
FIG. 2 is a diagram showing the detection of laser light emission from drive target laser diodes.

A laser light emitting device 10 according to an embodiment, as shown in FIG. 1, includes a power supply (denoted by VS in the FIG. 20, four laser light emitters 40, a light emission detector 60, and a controller 80. Of x, y, and z shown as orthogonal to each other in FIG. 1, x and y indicate directions along the surface of the printed circuit board of the laser light emitting device 10, and z indicates a direction orthogonal to the surface. The arrangement of the four laser light emitters 40 and a detection pattern 62 included in the light emission detector 60 is limited in accordance with the x, y, and z directions as described later. The other components, or the power supply 20, a detection resistor 64 and a comparator 66 in the light emission detector 60 described later, and the controller 80, may be arranged without limitation.

Each laser light emitter 40 includes a laser diode 44 and a drive circuit 42 that drives the laser diode 44 by controlling the turning on and off of the supply of power from the power supply 20 to the laser diode 44. The drive circuit 42 includes a field effect transistor (FET) as an element that turns on or off the supply of power to the laser diode 44. The drive circuit 42 and the laser diode 44 are connected to each other via a drive line 43 through which a drive current Idv flows from the drive circuit 42 to the laser diode 44. In the example of FIG. 1, the output of the drive circuit 42 is connected with the anode of the laser diode 44. However, the anode of the laser diode 44 may be connected to the power supply 20, with the cathode connected with the drive circuit 42.

In FIG. 1, to distinguish between the four laser light emitters 40 and their components, their reference numerals are followed by suffixes _1, _2, _3, and _4. The numbers of the suffixes indicate the order of the four laser light emitters 40 from the top in the figure. However, in the following description, the suffixes may be omitted when the four laser light emitters 40 are not distinguished from each other.

The four laser light emitters 40_1 to 40_4 are arranged with the drive lines 43_1 to 43_4 parallel to each other at predetermined intervals on the surface of the printed circuit board (not shown) facing in the +Z direction. In the example of FIG. 1, the drive lines 43_1 to 43_4 running straight in the x direction are arranged parallel to each other in the y direction, which is orthogonal to the x direction.

In the laser light emitters 40_1 to 40_4, the operations of the drive circuits 42_1 to 42_4 are controlled by the controller 80, and the laser diodes 44_1 to 44_4 are driven accordingly.

The controller 80 is, for example, a microcomputer, and its CPU executes a prepared program to control each of the drive circuits 42_1 to 42_4 of the laser light emitters 40_1 to 40_4, causing the laser diodes 44_1 to 44_4 to emit light in numerical order. The controller 80 also operates as a light emission detection processor 68 described later and detects the timing to drive the laser diode 44 of each laser light emitter, that is, the light emission timing. The detected drive timing is used for controlling the drive of the laser diode 44 of each laser light emitter 40.

The light emission detector 60 includes the detection pattern 62, the detection resistor 64, the comparator 66, and the light emission detection processor 68 in the controller 80. The detection pattern 62 is a wire pattern in the shape of a loop coil. The detection pattern 62 is positioned between the second drive line 43_2 and the third drive line 43_3 in a plan view of the printed surface on which the four laser light emitters 40_1 to 40_4 are arranged (the surface facing in the +Z direction). For a dual-layer printed circuit board, the detection pattern 62 is placed on the printed surface or the rear surface. For a multi-layer board having three or more layers, the detection pattern 62 is placed on any one of the printed surface, the rear surface, and an inner layer. The detection pattern 62 may also be placed across a plurality of layers.

In accordance with control by the controller 80, any one of the drive circuits 42_1 to 42_4 may operate to pass the corresponding one of the drive currents Idv_1 to Idv_4 through the corresponding one of the drive lines 43_1 to 43_4. Then, the current produces a magnetic field concentric around the drive line. The detection pattern 62 is placed within the produced magnetic field. The production of the magnetic field generates, in the detection pattern 62, a detection current Idt that varies with the electromagnetic induction dependent on changes in the direction and the magnitude of linked magnetic flux. In FIG. 1, a symbol with a dot inside a circle indicates flux linkage ϕ flowing in the +Z direction, while a symbol with a cross inside a circle indicates flux linkage ϕ flowing in the −Z direction. When the detection current Idt flows through the detection resistor 64 having a resistance value Rdt, the detection current Idt is converted into a detection voltage Vdt (=Idt·Rdt). In the following description, for the detection current Idt, the flow direction from the positive terminal to the negative terminal of the detection resistor 64 is described as being positive, whereas the flow direction from the negative terminal to the positive terminal is described as being negative. For the detection voltage Vdt, the direction corresponding to the positive detection current Idt is described as being positive, and the direction corresponding to the negative detection current Idt is described as being negative.

As shown in FIG. 2, when a drive target is the first laser diode 44_1 or the second laser diode 44_2, the flux linkage ϕ of the detection pattern 62 flows in the −Z direction, and the direction of the generated detection current Idt and the detection voltage Vdt is negative. In contrast, when a drive target is the third laser diode 44_3 or the fourth laser diode 44_4, the flux linkage ϕ of the detection pattern 62 flows in the +Z direction, and the direction of the generated detection current Idt and the detection voltage Vdt is positive. It is noted that the magnitude of flux linkage ϕ is inversely proportional to the distance from the drive line in which the drive current flows. Accordingly, the flux linkage ϕ, the detection current Idt, and the detection voltage Vdt are larger for the second laser diode 44_2 near the detection pattern 62 than for the first laser diode 44_1 near the detection pattern 62. Likewise, the flux linkage D, the detection current Idt, and the detection voltage Vdt are larger for the third laser diode 44_3 than for the fourth laser diode 44_4.

Consequently, the detection of the generation of the detection voltage Vdt corresponding to a detection current Idt enables the light emission from any of the laser diodes 44_1 to 44_4 to be detected indirectly. In addition, the detection of differences in the direction and the magnitude of the detection voltage Vdt enables determination of which of the laser diodes 44_1 to 44_4 has emitted the light.

The comparator 66 in the light emission detector 60 (see FIG. 1) outputs a pulsed differential signal indicating which of the laser diodes 44_1 to 44_4 is associated with the light emission timing in accordance with the direction and the magnitude of the input detection voltage Vdt. For example, when a negative detection voltage Vdt is generated, the comparator 66 outputs a pulsed differential signal with its voltage becoming higher at the negative output terminal than at the positive output terminal. When a positive detection voltage Vdt is generated, the comparator 66 outputs a pulsed differential signal with its voltage becoming higher at the positive output terminal than at the negative output terminal. The voltage difference between the positive output and the negative output of the comparator 66 varies with the magnitude of the detection voltage Vdt. For example, the output voltage difference is larger for the second laser diode 44_2 near the detection pattern 62 than for the first laser diode 44_1 near the detection pattern 62. Likewise, the output voltage difference is larger than for the third laser diode 44_3 than for the fourth laser diode 44_4.

The light emission detection processor 68 detects the change timing of differential output from the comparator 66 to detect the drive timing, that is, the light emission timing of any of the laser diodes 44_1 to 44_4. The light emission detection processor 68 also detects which of the laser diodes 44_1 to 44_4 is associated with the drive, that is, the light emission based on the state of the differential output, or specifically, the direction of the change and the difference in voltage. Thus, the light emission detection processor 68 can detect the drive timing, that is, the light emission timing of the laser diode 44 that is a drive target. This enables the controller 80 to control the drive, that is, the light emission of the drive target laser diode 44.

Furthermore, the light emission detection processor 68, during a period in which a change is to occur, can detect a failure in a drive target laser light emitter 40 by detecting the absence of change in differential output obtained from the comparator 66. Examples of detectable failures include an open-circuit failure in a drive circuit 42, which disrupts the supply of a drive current to the laser diode 44, as well as a short-circuit failure in a drive circuit 42 or a laser diode 44, which causes continuous supply of a drive current to the laser diode 44. In the event of a short-circuit failure, the above-described flux linkage ϕ of the detection pattern 62 does not change, and accordingly no detection current Idt is produced as for an open-circuit failure. The detection current Idt is a current produced by electromagnetic induction dependent on changes in the flux linkage ϕ caused by a drive current. Thus, with a drive current flowing continuously, the generation of a drive current to a drive target laser diode 44 cannot be detected, allowing the detection of a failure in the drive target drive circuit 42. However, in order to distinguish between an open-circuit failure and a short-circuit failure, it is necessary to detect the presence or absence of a generated drive current, such as the actual continuous generation of a drive current or the actual continuous emission of light.

As described above, the laser light emitting device 10 according to the present embodiment can detect light emission from each of the laser light emitters 40 and its light emission timing, and more specifically, the drive of the laser diode 44 and its drive timing using the single detection pattern 62. This enables the detection of the drive of a driven laser diode 44 and its drive timing with a configuration simpler and more inexpensive than the configuration described in the Background Art section. Further, actual light emission is not detected with a photodiode unlike the configuration described in the Background Art section, and thus the laser light emitting device 10 can accurately detect the drive timing of the laser diode 44 without being affected by ambient light. Furthermore, unlike a configuration including a current mirror circuit, the laser light emitting device 10 can accurately detect the drive timing of the laser diode 44 without being affected by a decrease in the operational speed of the drive circuit 42. The laser light emitting device 10 can also identify the faulty one of the laser light emitters 40. In addition, detectable failures include not only an open-circuit failure in the drive circuits 42 but also a short-circuit failure in the drive circuits 42 or the laser diodes 44.

B. Modified Embodiments

B1. Modified Embodiment 1

As described in the above embodiment, the detection pattern 62 is positioned between the second drive line 43_2 and the third drive line 43_3 and used to detect the driven one of the four laser diodes 44_1 to 44_4 based on differences in the direction and the magnitude of the detection current, or more specifically, differences in the direction and the magnitude of the detection voltage into which the detection current is converted. The detection uses differences in flux linkage direction and differences in flux linkage magnitude that are caused by the different positional relationships between the detection pattern 62 and the four drive lines 43_1 to 43_4. As long as differences in flux linkage direction and differences in flux linkage magnitude can be used, the detection pattern 62 may be placed, for example, between the first drive line 43_1 and the second drive line 43_2 or between the third drive line 43_3 and the fourth drive line 43_4.

Figure 3:
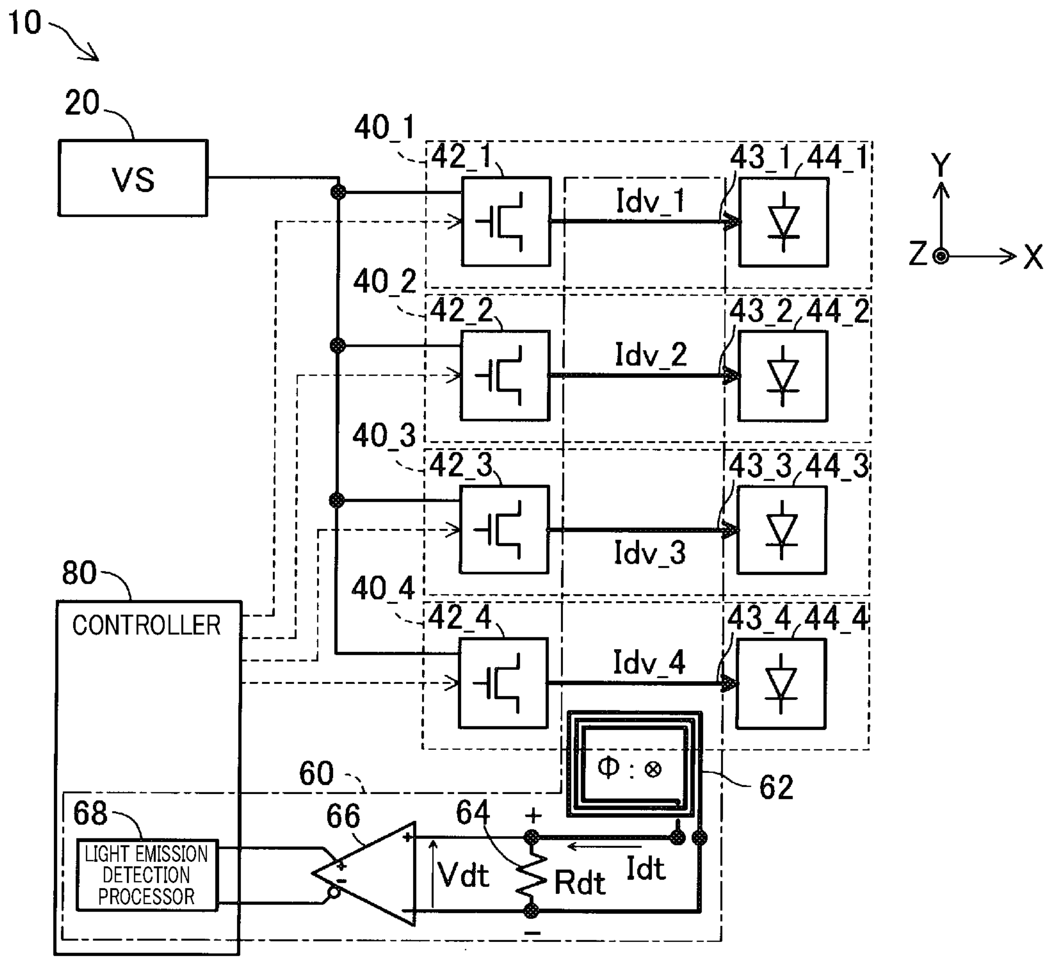
FIG. 3 is a schematic configuration diagram of the laser light emitting device with the detection pattern repositioned.

Alternatively, as shown in FIG. 3, the detection pattern 62 may be placed on the opposite side of the fourth drive line 43_4 from the other drive lines 43_1 to 43_3. In this case, although the detection voltage Vdt has the same direction, its magnitude varies depending on the distances between the detection pattern 62 and the drive lines 43_1 to 43_4, and thus the detection of the differences enables the detection of the driven one of the four laser diodes 44_1 to 44_4. Similarly, although not shown, the detection pattern 62 may be placed on the opposite side of the first drive line 43_1 from the other drive lines 43_2 to 43_4.

Although the four drive lines 43_1 to 43_4 described in the above example are arranged parallel to each other, the arrangement may not be parallel. No limitation is placed on the arrangement as long as the arrangement provides differences in flux linkage direction and differences in flux linkage magnitude that are caused by the different positional relationships between the detection pattern 62 and the four drive lines 43_1 to 43_4.

In other words, the detection pattern 62 may be placed with respect to the drive lines 43 in a manner that allows different detection currents to be generated in accordance with at least one of the difference in the positional relationship between each drive line 43 and the detection pattern 62, such as the distance between the detection pattern 62 and each drive line 43, and the difference in the flux linkage direction of the detection pattern 62 caused by a drive current flowing through the drive line 43.

B2. Modified Embodiment 2

Figure 4:
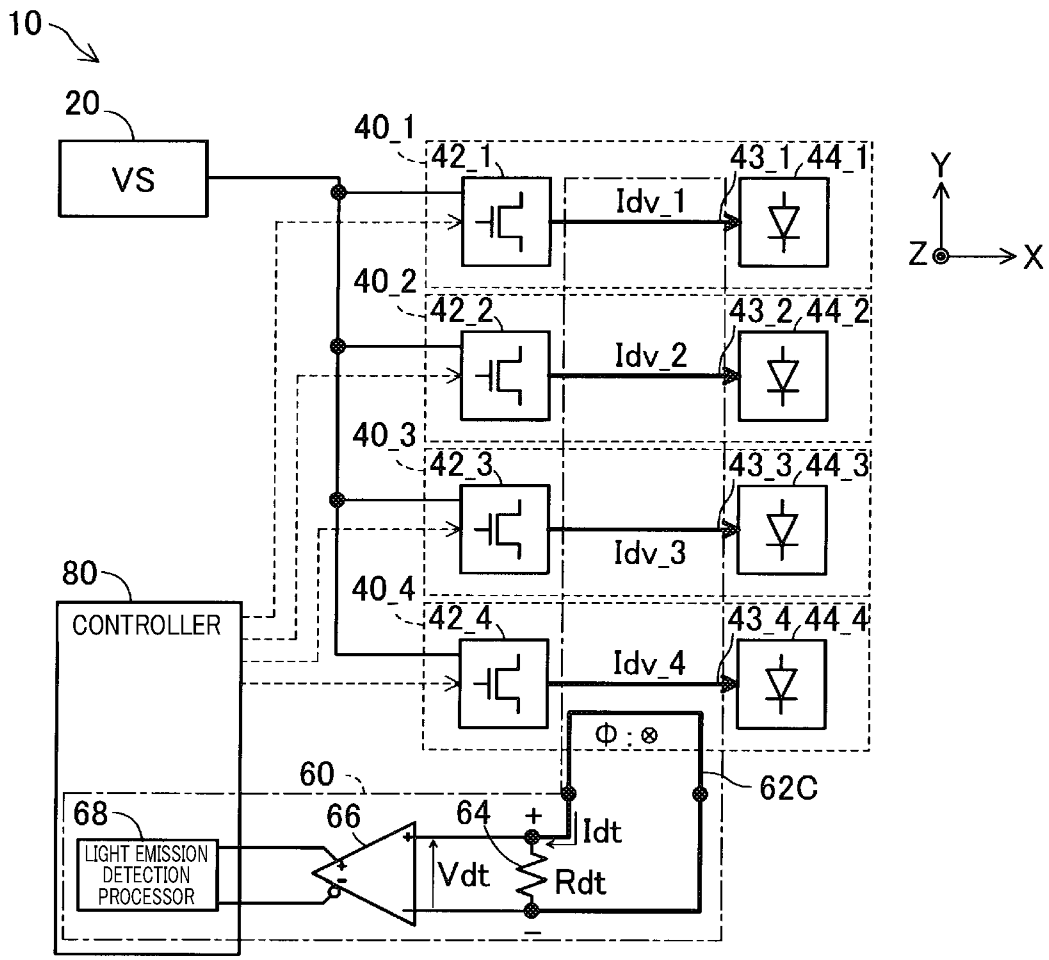
FIG. 4 is a schematic configuration diagram of the laser light emitting device with the detection pattern reshaped.

The detection pattern 62 (see FIG. 1) according to the above embodiment has been described as a wire pattern in the shape of a loop coil by way of example. However, the pattern is not limited to this shape, and as shown in FIG. 4, may be a detection pattern 62C including a wire pattern running along the drive lines 43 and connected to the detection resistor 64 to form a closed loop. However, for use of the detection pattern 62C, as shown in FIG. 4, it is preferable to place the detection pattern 62C on the opposite side of the fourth drive line 43_4 from the other drive lines 43_1 to 43_3. Alternatively, although not shown, it is also preferable to place the detection pattern 62C on the opposite side of the first drive line 43_1 from the other drive lines 43_2 to 43_4. For example, this is because, in FIG. 4, with the detection pattern 62C placed between the second drive line 43_2 and the third drive line 43_3 as in FIG. 1, it is difficult to detect a change in flux linkage produced by drive currents flowing through the third drive line 43_3 and the fourth drive line 43_4.

B3. Modified Embodiment 3

In the above embodiment and modified embodiments 1 and 2, the drive lines 43_1 to 43_4 are described as being straight and arranged parallel to each other. However, the drive currents Idv flowing from the drive circuits 42 to the laser diodes 44 through the drive lines 43 are circular currents, actually. Specifically, each drive current Idv flows, for example, from a bypass capacitor serving as an AC power supply for the drive circuit 42, through one power line to the drive circuit 42, then flows from the drive circuit 42 through the drive line 43 to the laser diode 44, and returns to the bypass capacitor via a line returning to the AC power supply (the other power line). In this case, the magnetic flux of the magnetic field generated by the drive current Idv is actually not only the magnetic flux of the magnetic field resulting from the current flowing through the drive line 43.

Figure 5:
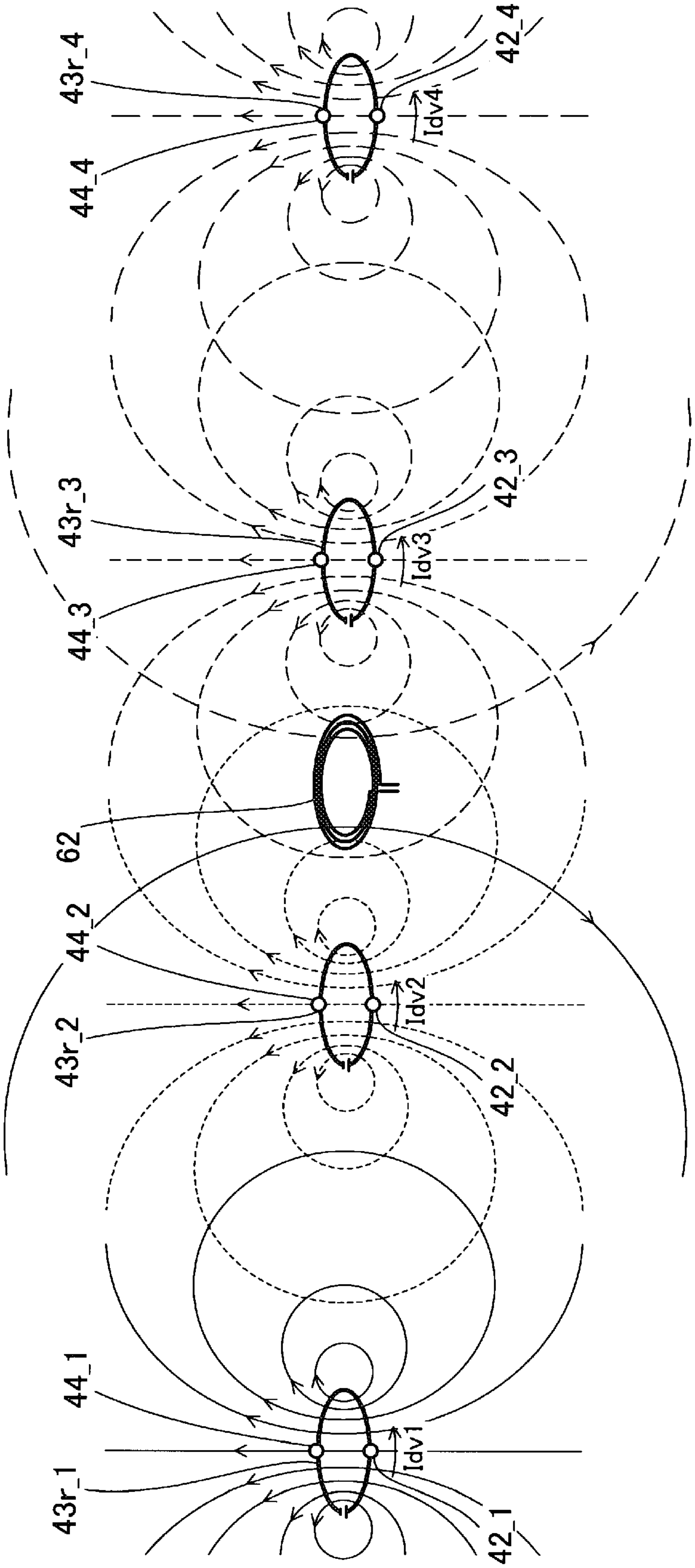
FIG. 5 is a diagram illustrating magnetic flux linked with the detection pattern.

It is now assumed that the drive lines are, as shown in FIG. 5, circular lines 43*r*_1 to 43*r*_4 extending from power supplies (bypass capacitors) respectively through the drive circuits 42_1 to 42_4 and the laser diodes 44_1 to 44_4 and returning to the power supplies. In this case, drive currents Idv1 to Idv4 that are circular currents respectively flowing through the circular lines 43*r*_1 to 43*r*_4 generate, for example, the magnetic flux of the magnetic field illustrated in FIG. 5. However, the magnetic flux contributing to the detection current Idt of the detection pattern 62 is magnetic flux linked with the detection pattern 62 (flux linkage). Thus, all the circular currents flowing through the circular lines 43*r* may not be taken into account, and the currents to be taken into account are the currents that correspond to the flux linkage contributing to the generation of the detection current Idt of the detection pattern 62.

Thus, in the above embodiment and modified embodiments 1 and 2, for ease of illustration, the detection of the detection current Idt generated by the flux linkage of the detection pattern 62 has been described based only on the magnetic flux of the magnetic field generated by each drive current Idv flowing through the drive line 43 connecting the drive circuit 42 and the laser diode 44.

Note that the drive lines 43_1 to 44_4 are not limited to straight drive lines arranged parallel to each other. Relative to the magnetic flux of the magnetic field generated by the drive current Idv flowing through each drive line 43, as long as the magnitude and the direction of the magnetic flux linked with the detection pattern 62 provide a difference in the magnitude of the detection current Idt generated in the detection pattern 62, the drive lines are not limited to a particular shape.

Alternatively, each drive line may not be simplified as in the above embodiment and modified embodiments 1 and 2, but may be treated as a circular line 43*r* extending from the power supply through the drive circuit 42 and the laser diode 44 and returning to the power supply. In this case, as long as the magnitude and the direction of the flux linkage of the detection pattern 62 are determined so as to provide a difference in the magnitude of the detection current Idt generated in the detection pattern 62, each circular drive line may have any shape. In the wire pattern of the circular line 43*r* on the printed board, the wire pattern extending from the power supply (bypass capacitor) through the drive circuit 42 to the laser diode 44 may not be provided in the same printed board layer as the wire pattern returning from the laser diode 44 to bypass capacitor, and it is preferable to provide these patterns in different layers of a multi-layer printed board. This enables the outward wire pattern and the returning wire pattern to be aligned in a direction orthogonal to the printed board, thus allowing the circular line 43*r* to be shortened to reduce the inductance. In addition, the magnetic fields generated by currents flowing through the two wire patterns can be aligned in the same direction. This alignment can increase the magnitude of the flux linkage of the detection pattern 62 and accordingly increase the detection current Idt, thus enabling the detection accuracy to be improved.

B4. Modified Embodiment 4

In the above embodiment and modified embodiments 1 and 2, although the four laser light emitters 40_1 to 40_4 emit light in numerical order, light emission is not limited to this order. The four laser light emitters 40_1 to 40_4 may emit light in turn not in numerical order. Alternatively, a plurality of laser light emitters may emit light at the same time. Also in this case, at least the drive timing, that is, the light emission timing of the driven laser diode 44 can be detected.

B5. Modified Embodiment 5

In the above embodiment and modified embodiments 1 and 2, the configuration in which a single drive circuit 42 drives a single laser diode 44 has been described by way of example. However, the driving is not limited to this example. A plurality of laser diodes that emit light at the same time may be treated as a single laser diode and driven by a single drive circuit. Alternatively, a plurality of drive circuits driven at the same time may drive a single laser diode, or a plurality of laser diodes for emitting light at the same time may be driven as a single laser diode.

B6. Modified Embodiment 6

In the above embodiment and modified embodiments 1 and 2, the configuration including the four laser light emitters 40 has been described by way of example. However, two or any greater number of laser light emitters 40 may be used.

B7. Modified Embodiment 7

The present disclosure may be implemented in various forms other than a laser light emitting device. For example, the disclosure may be implemented in various device forms such as an object detection device including a laser light emitting device. The object detection device is a radar that emits laser light as irradiation light, receives light including reflected light from targets, and detects the presence or absence of a target and object information such as the distance to the target (also referred to as light detection and ranging, LiDAR).

B8. Modified Embodiment 8

The controller and its technique described in the present disclosure may be implemented by a special purpose computer including memory and a processor programmed to execute one or more functions embodied by computer programs. Alternatively, the controller and its technique described in the present disclosure may be implemented by a special purpose computer including a processor formed of one or more dedicated hardware logic circuits. Alternatively, the controller and its technique described in the present disclosure may be implemented by one or more special purpose computers including a combination of memory and a processor programmed to execute one or more functions and a processor formed of one or more dedicated hardware logic circuits. The computer programs may be stored in a non-transitory, tangible computer readable storage medium as instructions executed by a computer.

The present disclosure is not limited to the above embodiments but may be implemented in a variety of ways without departing from the spirit and scope thereof. For example, the technical features in each embodiment corresponding to the technical features in the aspects described in the Summary section may be replaced or combined as appropriate so as to solve some or all of the above-described problems or achieve some or all of the above-described advantageous effects. Unless described herein as being necessary, the technical features may be deleted as appropriate.

What is claimed is:

1. A laser light emitting device comprising:

a plurality of laser light emitters each including a laser diode, a drive circuit configured to drive the laser diode by controlling supply of a drive current to the laser diode, and a drive line through which the drive current flows from the drive circuit to the laser diode; and a light emission detector including a single detection pattern placed so as to cause an electromagnetically induced current to flow in response to a drive current flowing through each drive line when the corresponding laser light emitter emits light, the light emission detector configured to detect light emission from a driven laser diode by using a combination of a direction and a magnitude of the current flowing in the detection pattern, wherein the light emission detector is configured to determine which of the laser diodes has emitted light based on differences in the direction and the magnitude of the current, or a voltage corresponding to the current, the single detection pattern is disposed between the drive lines of the plurality of laser light emitters, and the single detection pattern is a loop coil shaped pattern forming a single continuous loop region, the single detection pattern does not include any loop portion surrounding an individual one of the laser light emitters, the drive circuits, or the drive lines, and magnetic fluxes generated from two or more of the drive lines pass through the single continuous loop region.

2. The laser light emitting device according to claim 1, wherein the plurality of laser light emitters emit light in turn.

3. The laser light emitting device according to claim 1, wherein the drive lines of the plurality of laser light emitters are positioned so as to have different positional relationships with the detection pattern.

* * * * *